United States Patent
Lee et al.

(10) Patent No.: US 6,885,462 B2
(45) Date of Patent: Apr. 26, 2005

(54) WAVELENGTH MONITORING DEVICE AND METHOD OF TUNABLE LASER SOURCES

(75) Inventors: San-Liang Lee, Taipei (TW); Chun-Liang Yang, Yilan Hsien (TW); Yun-Lung Chou, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 307 days.

(21) Appl. No.: 10/295,884

(22) Filed: Nov. 18, 2002

(65) Prior Publication Data

US 2003/0218759 A1 Nov. 27, 2003

(30) Foreign Application Priority Data

May 27, 2002 (TW) ........................................ 91111215 A

(51) Int. Cl.⁷ .............................................. G01B 9/02
(52) U.S. Cl. ......................................... 356/519; 372/28
(58) Field of Search ................................. 356/519, 450; 372/32, 28; 359/247

(56) References Cited

U.S. PATENT DOCUMENTS 6,291,813 B1 * 9/2001 Ackerman et al. ...... 250/214 R
6,611,341 B1 * 8/2003 May .......................... 356/519

OTHER PUBLICATIONS

Optical Fiber Communications Conference and Exhibit 2002; Mar. 17–22, 2002; Anaheim Convention Center, Anaheim, California; pp. 393–395.

* cited by examiner

Primary Examiner—Andrew H. Lee
(74) Attorney, Agent, or Firm—Bacon & Thomas PLLC

(57) ABSTRACT

There are disclosed a wavelength monitoring device of tunable laser sources and a method thereof. A Fabry-Perot etalon is provided to detect the wavelength drift, and furthermore, a Fabry-Perot laser diode or a light emitting diode is provided to recognize the channel of the wavelength. The wavelength drift is used to determine the junction voltage of each corresponding channel in advance. Then, the actually detected junction voltage of the diode is used to determine the channel of the wavelength, thereby accurately detecting the actual channel wavelength.

11 Claims, 6 Drawing Sheets

WAVELENGTH MONITORING DEVICE AND METHOD OF TUNABLE LASER SOURCES

BACKGROUND OF THE INVENTION

1. Field of the Invention

The present invention relates to the technical field of wavelength monitoring and, more particularly, to a high-resolution wavelength monitoring device of tunable laser source and method thereof.

2. Description of Related Art

The rapid development of network technology leads to an increasing use of optical fiber communication. The optical fiber communication provides a low-loss and very high information transmission capacity. With the dense wavelength division multiplexing (DWDM) technique, an optical fiber is capable of simultaneously transmitting 16, 32, or more different wavelengths. In such a dense channel spacing, wavelength drift may cause a severe cross-talk problem. Thus, a wavelength monitoring on laser sources is very important. Moreover, tunable laser sources are very important components in DWDM systems, as for example, a spare light source having multi-wavelength switching output or a fast wavelength-switching device. As such, the fast wavelength tuning and multi-wavelength output factors must be considered in dealing with the wavelength monitoring for tunable laser sources.

Fabry-Perot (FP) etalon is commercially available for monitoring single-wavelength lasers, like distributed feedback (DFB) lasers. The Fabry-Perot etalon has a periodical spectral characteristic, and thus, it is good for monitoring a laser source with a single wavelength. It is difficult to apply a FP etalon to monitor a tunable laser and to detect the potential mode-hopping phenomenon of a laser source. Furthermore, although the Fabry-Perot tunable filter or arrayed waveguide grating (AWG) is applicable to monitor the tunable laser sources, its tuning speed or cost is not satisfactory. In addition, although the detection of transparent current or junction voltage of a single Fabry-Perot laser diode has demonstrated to reach a resolution of 0.01 nm wavelength, the requirement on the stability of temperature control is very difficult to achieve.

U.S. Pat. No. 5,825,792 discloses a "wavelength monitoring and control assembly for WDM optical transmission systems", which is used in wavelength monitoring for single-wavelength DFB laser source.

U.S. Pat. No. 5,617,234 discloses a "multiwavelength simultaneous monitoring circuit employing arrayed-waveguide grating", which can achieve a high accuracy discrimination of individual wavelengths of a WDM signal, and which is suitable for implementing in the form of optical integrated circuits. However, the major component employed is an AWG and there are a plurality of photodetectors required, which results in an extremely high cost in implementing the monitoring circuit. Therefore, there is a desire to improve the above conventional wavelength monitoring devices of laser sources to mitigate and/or obviate the aforementioned problems.

SUMMARY OF THE INVENTION

The object of the present invention is to provide a wavelength monitoring device of laser source and method thereof to correctly detect the actual wavelength of a channel.

In accordance with one aspect of the present invention, there is provided a wavelength monitoring device of tunable laser sources, which comprises: a beam splitter for splitting a light beam from the tunable laser source into a first incident beam and a second incident beam; a first optical component for receiving the first incident beam and detecting a wavelength drift of the light beam; a second optical component for receiving the second incident beam and recognizing the channel number of the light beam; and a control unit for determining, based on the wavelength drift, the junction voltage of each channel for the second optical component under the wavelength drift, and, based on the determined junction voltage, using the second optical component to actually detect the junction voltage of each channel and distinguish its channel number, thereby determining an actual wavelength of each channel.

In accordance with another aspect of the present invention, there is provided a wavelength monitoring method, which comprises the steps of: (A) detecting a wavelength drift by the first optical component; (B) calculating a junction voltage of each channel of the second optical component under the wavelength drift by the wavelength drift, relation between the channel junction voltage and channel wavelength of the second optical component, and slope of each channel's junction voltage versus wavelength drift; (C) using the second optical component to actually detect a junction voltage between the calculated junction voltage minus a margin voltage and the calculated junction voltage plus the margin voltage, and distinguish its channel number; and (D) determining an actual wavelength of the channel.

Other objects, advantages, and novel features of the invention will become more apparent from the detailed description when taken in conjunction with the accompanying drawings.

DETAILED DESCRIPTION OF THE PREFERRED EMBODIMENT

Figure 1:
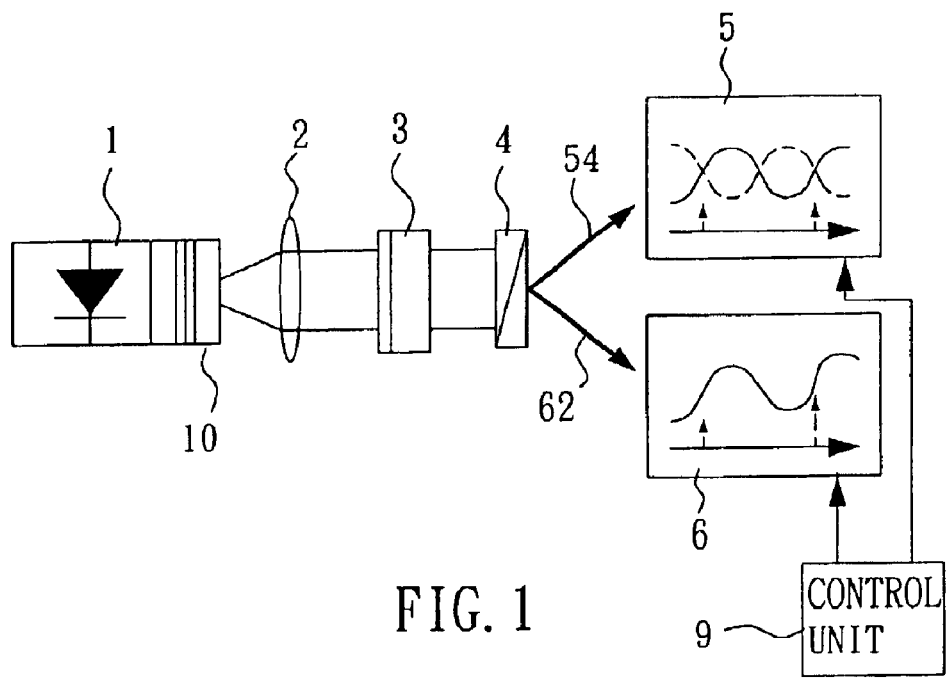
FIG. 1 is a schematic diagram of a wavelength monitoring device of tunable laser source in accordance with the present invention.

With reference to FIG. 1, there is shown a wavelength monitoring device of tunable laser source in accordance with one preferred embodiment of the present invention, which comprises a tunable laser source 1, a collimator 2, a modulator 3, a beam splitter 4, a first optical component 5, a second optical component 6, and a control unit 9. Laser from the rear end 10 of the tunable laser source 1 is used as the light beam for wavelength monitoring. Also, the light beam is provided with a plurality of tunable channels. The collimator 2 can control the divergence of the light beam for being directed to the modulator 3. The modulator 3 adds modulated signals to the light beam for increasing sensitivity. The beam splitter 4 is provided for splitting the light beam into two light beams (e.g., incident beams 54 and 62), which are provided to the first and second optical components 5 and 6, respectively.

Figure 2:
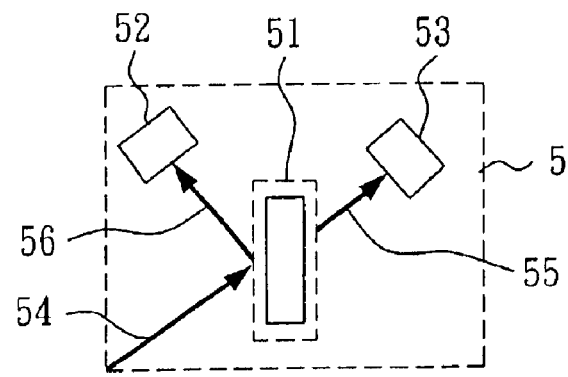
FIG. 2 is a schematic diagram of the first optical component of the wavelength monitoring device.

The first optical component 5 is an optical element having a periodical spectrum response characteristic, such as a Fabry-Perot etalon, a Mach-Zehner interferometer (MZI), or an AWG, for detecting a wavelength drift. For example, in the embodiment, as shown in FIG. 2, the first optical component 5 includes a Fabry-Perot etalon 51 and a pair of photodetectors 52 and 53. When the incident beam 54 injects on the Fabry-Perot etalon 51, part of the first incident beam 54 is reflected to the first photodetector 52 (referred as the reflected beam 56) and the other penetrates the Fabry-Perot etalon 51 to reach the second photodetector 53 (referred as transmitted beam 55). Thus, it is possible to determine the wavelength drift of the incident beam 54 by comparing the optical power of the transmitted beam 55 detected by the second photodetector 53 with that of the reflected beam 56 detected by the first photodetector 52.

Figure 3:
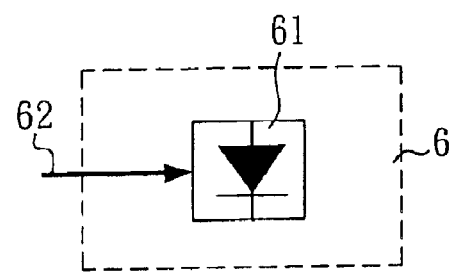
FIG. 3 is a schematic diagram of a second optical component of the wavelength monitoring device.

The second optical component 6 is an optical element having a segmented periodically monotonous, or monotonous, spectral characteristic, such as a Fabry-Perot laser diode, a light emitting diode (LED), or a semiconductor optical amplifier (SOA), for recognizing a channel of a specific wavelength. As shown in FIG. 3, the second optical component 6 is implemented as a Fabry-Perot laser diode 61 for recognizing a channel of the incident beam 62.

Figure 4:
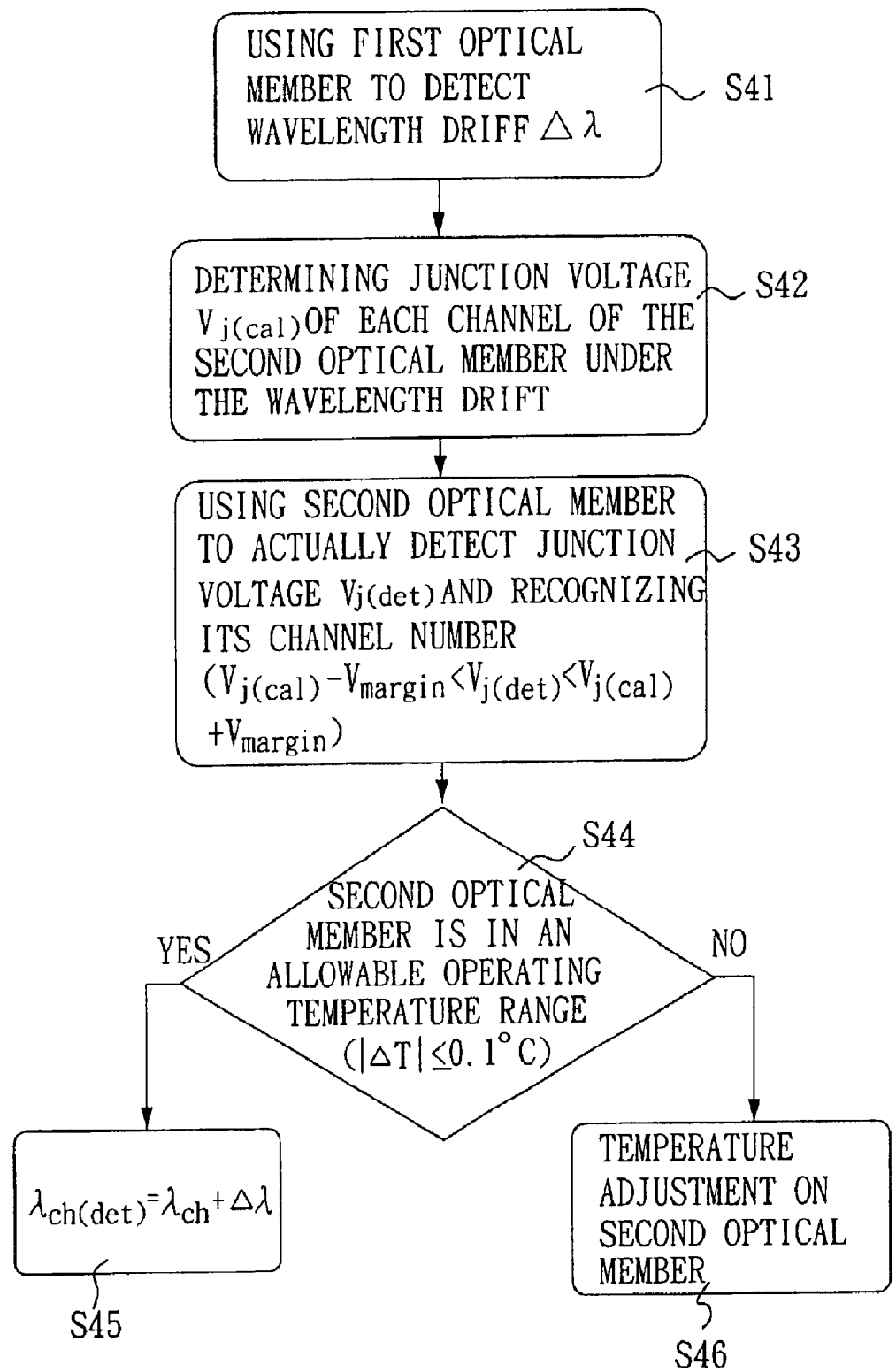
FIG. 4 is a flow chart of the wavelength monitoring method of tunable laser source in accordance with the present invention.

The control unit 9 is provided to control the first and second optical components 5 and 6 for performing a wavelength monitoring. FIG. 4 shows the control flow. At first, the first optical component 5 detects a wavelength drift $\Delta\lambda$ by dividing the transmitted beam 55 by the reflected beam 56 to obtain a ratio which is in turn used to correspond an actual wavelength drift $\Delta\lambda$ of channel (step S41).

In step S42, by plotting the wavelength drift $\Delta\lambda$, the relation between the channel junction voltage $V_{j(ch)}$ and channel wavelength $\lambda_{ch}$ of the second optical component 6, and the slope of each channel's junction voltage $V_{j(ch)}$ versus wavelength drift, it is determined a junction voltage $V_{j(cal)}$ of each channel of the second optical component 6 under the wavelength drift $\Delta\lambda$.

In step S43, the second optical component 6 is used to actually detect a junction voltage $V_{j(det)}$ between the junction voltage $V_{j(cal)}$−margin voltage $V_{margin}$ and the junction voltage $V_{j(cal)}$+margin voltage $V_{margin}$, and further, recognize its channel number, wherein the margin voltage $V_{margin}$ is determined by the characteristic curve of the second optical component 6. For the purpose of ensuring an accuracy of the junction voltage, in step S44, it is determined whether the characteristic curve of the second optical component 6 is within an allowable operating temperature range, for example, $|\Delta T| \leq 0.1°$ C. If yes, it is able to accurately obtain the actual wavelength of the detected channel as: $\lambda_{ch(det)} = \lambda_{ch} + \Delta\lambda$ (step S45). Otherwise, it indicates that the characteristic curve of the second optical component 6 is out of the allowable operating temperature range. A temperature adjustment is required to correct $\Delta\lambda$ (step S46), and this monitoring process is executed again for continuously monitoring wavelength of the tunable laser source 1.

Figure 5:
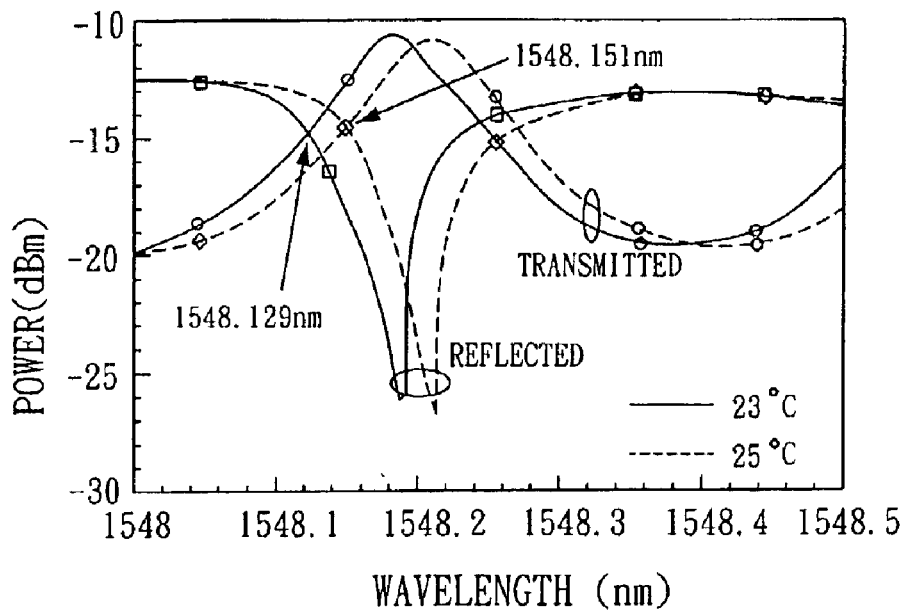
FIG. 5 illustrates the spectrums of transmitted beam and reflected beam for the Fabry-Perot etalon.
Figure 6:
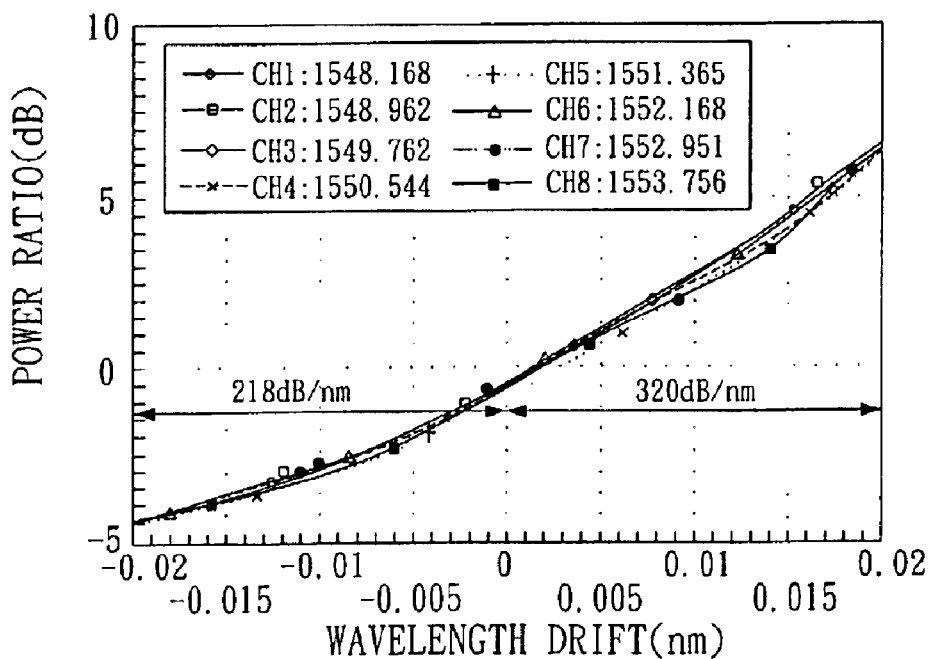
FIG. 6 illustrates the detected wavelength drift by using the Fabry-Perot etalon.
Figure 7:
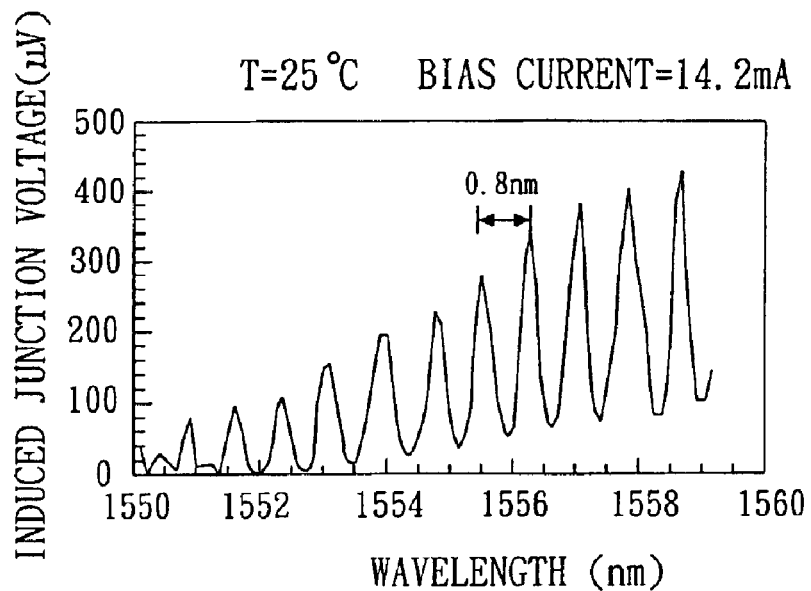
FIG. 7 illustrates the curve of junction voltage versus wavelength for the Fabry-Perot laser diode.
Figure 8:
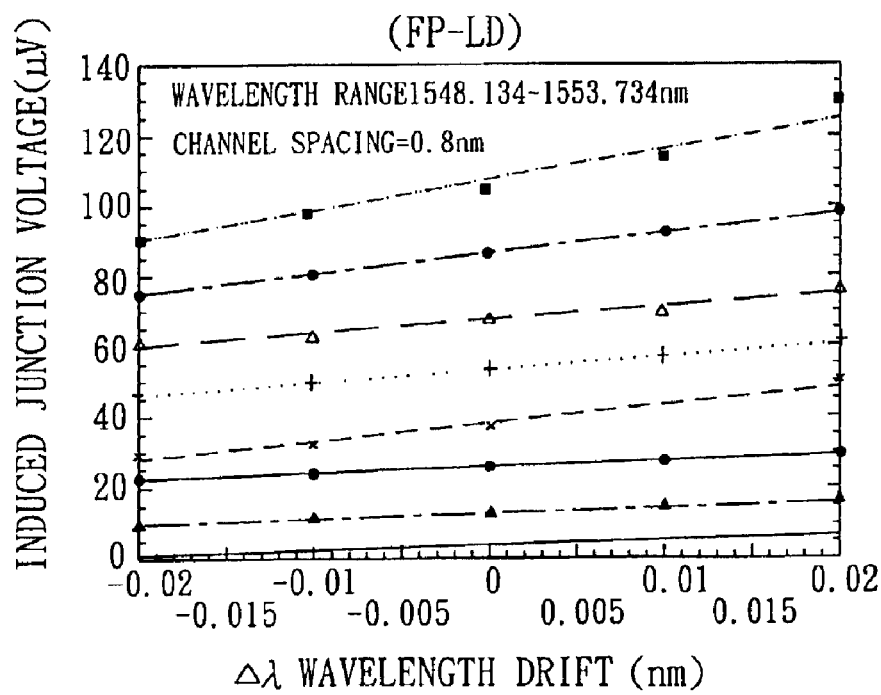
FIG. 8 illustrates the junction voltage of each channel when the wavelength drift is within ±0.02 nm by using a Fabry-Perot laser diode to recognize the channel of the wavelength.
Figure 9:
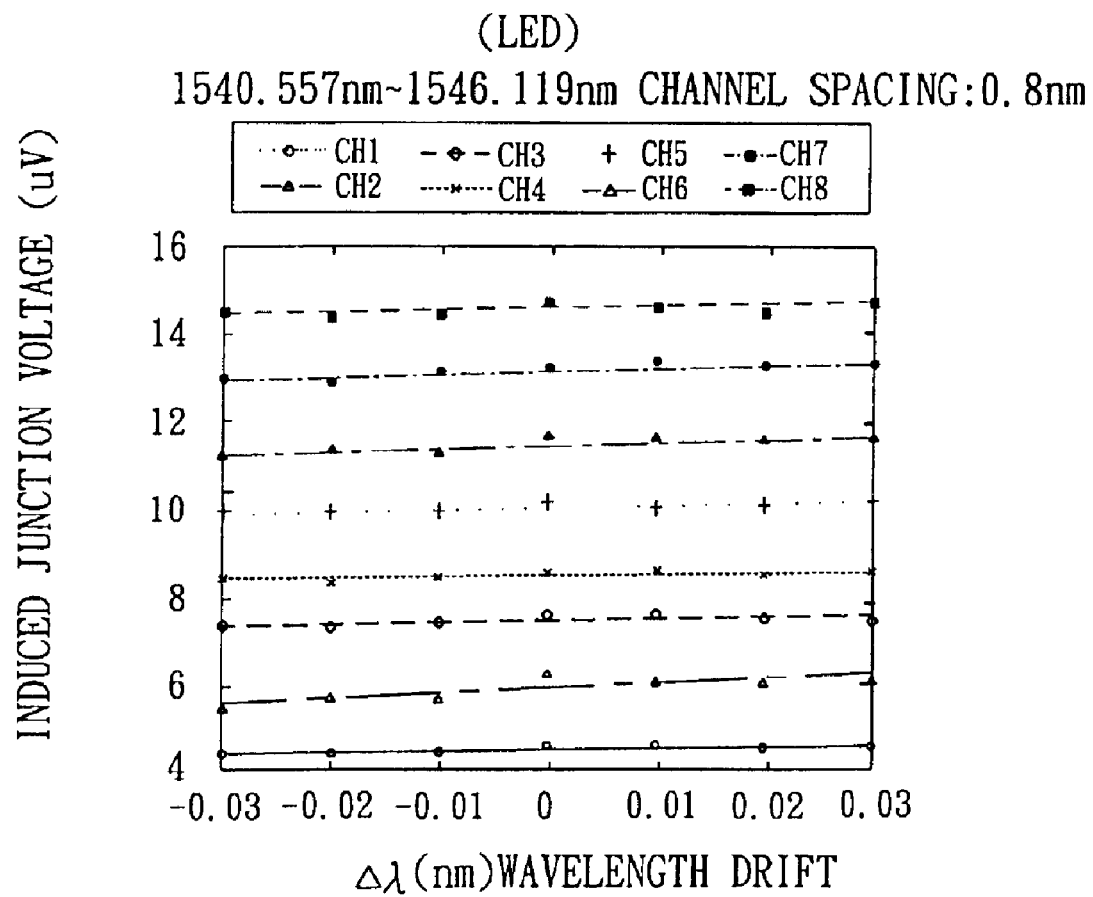
FIG. 9 illustrates the junction voltage of each channel when the wavelength drift is within ±0.03 nm by using a LED to recognize the channel of the wavelength.
Figure 10:
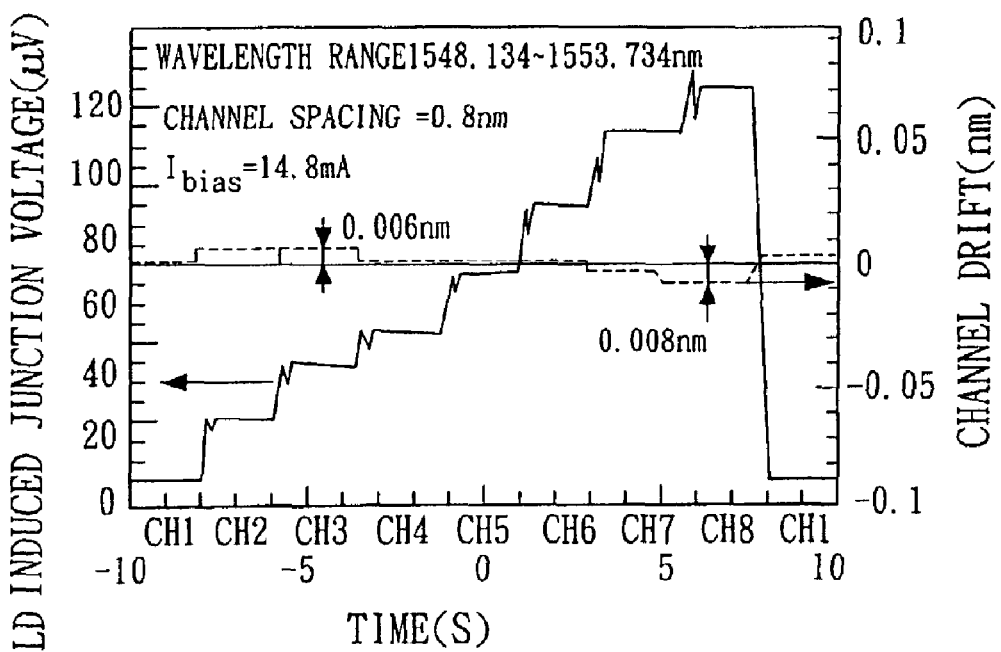
FIG. 10 demonstrates system experimental values of tunable wavelength monitoring when continuously tuning eight 100-GHz channel spacing.

As aforementioned, the first and second optical components 5 and 6 are preferably Fabry-Perot etalon 51 and Fabry-Perot laser diode 61, respectively, which have a free spectral range compatible with the spacing of the ITU (International Telecommunication Union) grid channel wavelength. A number of experiment steps are performed for validating the novel effect of the invention. At first, each ITU channel wavelength of the tunable laser source 1 is aligned with a cross-point of spectrum (within a range of ±0.02 nm) of transmitted beam (detected by the photodetector 53) and reflected beam (detected by the photodetector 52), as shown in in FIG. 5, so as to monitor and lock a specific wavelength. Then, a ratio of the transmitted beam 55 (detected by the photodetector 53) to the reflected beam 56 (detected by the photodetector 52) is utilized to detect the wavelength drift $\Delta\lambda$, as shown in FIG. 6. At the same time, it is able to monitor an output optical power of the tunable laser source 1 by utilizing the sum of the transmitted beam 55 and the reflected beam 56. Thus, it is easy to achieve wavelength drift and optical power detection. Moreover, the Fabry-Perot laser diode 61 of the second optical component 6 acts to recognize a channel. With reference to FIG. 7, there is shown a graph of junction voltage of the Fabry-Perot laser diode 61 versus wavelength. For recognizing a channel, it is necessary to determine the window of the wavelength to be monitored. The Fabry-Perot laser diode 61 is applied with a suitable constant bias current to make the wavelength window be operating in a gain region and control the temperature of the Fabry-Perot laser diode 61, thereby making each ITU channel wavelength be aligned with a center point of the positive slope of the junction voltage for obtaining an optimal channel monitoring sensitivity. FIGS. 8 and 9 illustrate the junction voltages of each channel when the wavelength drift is within ±0.02 nm and ±0.03 nm by using the Fabry-Perot laser diode and LED to recognize the channel of the wavelength, respectively. As shown, the junction voltage of each channel can be clearly distinguished. FIG. 10 demonstrates system experimental values of tunable wavelength monitoring when continuously tuning eight 100-GHz channel spacing, which can correctly recognize the junction voltage and wavelength drift of each channel. As a result, the actual wavelength of each channel can be monitored and determined.

In view of the foregoing, the invention can eliminate the drawbacks of the prior art in which the Fabry-Perot etalon cannot recognize the actual wavelength of channel and mode-hopping phenomenon of laser sources, and can fast monitor the wavelength timing for tunable laser sources. The components employed in the present invention are suitable for being fabricated in integration. Thus, the present wavelength monitoring device can be easily fabricated as an integrated device.

Although the present invention has been explained in relation to its preferred embodiment, it is to be understood that many other possible modifications and variations can be made without departing from the spirit and scope of the invention as hereinafter claimed.

What is claimed is:

1. A wavelength monitoring device of tunable laser sources comprising:

a beam splitter for splitting a light beam from the tunable laser source into a first incident beam and a second incident beam;

a first optical component for receiving the first incident beam and detecting a wavelength drift of the light beam;

a second optical component for receiving the second incident beam and recognizing a channel for the wavelength of the light beam; and a control unit for determining, based on the wavelength drift, a junction voltage of each channel of the second optical component under the wavelength drift, and, based on the determined junction voltage, using the second optical component to actually detect the junction voltage of each channel and distinguish its channel number, thereby determining an actual wavelength of each channel.

2. The wavelength monitoring device of tunable laser sources as claimed in claim 1, wherein the first optical component comprises:

a Fabry-Perot etalon for reflecting a portion of the first incident beam for as a reflected beam and allowing the second incident beam used as a transmitted beam to penetrate the Fabry-Perot etalon; a first photodetector for detecting the reflected beam; and a second photodetector for detecting the transmitted beam, wherein a wavelength drift of the first incident beam is determined by dividing the transmitted beam by the reflected beam.

3. The wavelength monitoring device of tunable laser sources as claimed in claim 1, wherein the second optical component is a Fabry-Perot laser diode with a bias circuit.

4. The wavelength monitoring device of tunable laser sources as claimed in claim 1, wherein the second optical component is a light emitting diode (LED) with a bias circuit.

5. The wavelength monitoring device of tunable laser sources as claimed in claim 1, further comprising a modulator for adding modulated signals to the light beam for increasing sensitivity.

6. The wavelength monitoring device of tunable laser sources as claimed in claim 5, further comprising a collimator for directing the light beam to the modulator.

7. A wavelength monitoring method of tunable laser sources using a beam splitter for splitting a light beam with a plurality tunable channels generated by a tunable laser source into a first incident beam and a second incident beam for being injected to a first optical component and a second optical component, respectively, the first optical component being capable of detecting a wavelength drift of the light beam, the second optical component being capable of recognizing a channel for the wavelength of the light beam, the wavelength monitoring method comprising the steps of:

(A) detecting a wavelength drift by the first optical component;

(B) calculating a junction voltage of each channel of the second optical component under the wavelength drift by the wavelength drift, relation between the channel junction voltage and channel wavelength of the second optical component, and slope of each channel's junction voltage versus wavelength drift;

(C) using the second optical component to actually detect a junction voltage between the calculated junction voltage minus a margin voltage and the calculated junction voltage plus the margin voltage, and distinguish its channel number; and (D) determining an actual wavelength of the channel.

8. The wavelength monitoring method as claimed in claim 7, further comprising a step, between the steps (C) and (D), for determining whether the second optical component has a characteristic curve within an allowable operating temperature range, and if no, adjusting the second optical component.

9. The wavelength monitoring method as claimed in claim 7, wherein the first optical component is a Fabry-Perot etalon and the second optical component is a Fabry-Perot laser diode with a bias circuit.

10. The wavelength monitoring method as claimed in claim 7, wherein the first optical component is a Fabry-Perot etalon and the second optical component is a light emitting diode (LED) with a bias circuit.

11. The wavelength monitoring method as claimed in claim 7, which is applied in monitoring the performance of a dense wavelength division multiplexing (DWDM) network.

* * * * *